United States Patent [19]

Galich et al.

[11] Patent Number: 5,031,028
[45] Date of Patent: Jul. 9, 1991

[54] HEAT SINK ASSEMBLY

[75] Inventors: Michael G. Galich, Park Ridge; Dale G. Johnson, Lake Zurich, both of Ill.

[73] Assignee: Motorola, Inc., Schaumburg, Ill.

[21] Appl. No.: 633,154

[22] Filed: Dec. 21, 1990

Related U.S. Application Data

[63] Continuation of Ser. No. 516,843, Apr. 30, 1990, abandoned.

[51] Int. Cl.[5] ............. H01L 23/02; H01L 25/04; H01L 23/26
[52] U.S. Cl. .................. 357/81; 357/84; 174/16.3; 174/52.5
[58] Field of Search ............ 357/81, 70, 84; 174/15.3, 52.5

[56] References Cited

U.S. PATENT DOCUMENTS

| | | | |
|---|---|---|---|
| 4,481,525 | 11/1984 | Calabro et al. | 357/74 |
| 4,521,828 | 6/1985 | Fanning | 357/70 |
| 4,599,680 | 7/1986 | Gibson et al. | 357/81 |
| 4,605,058 | 8/1986 | Wilens | 357/81 |
| 4,707,726 | 11/1987 | Tinder | 357/74 |
| 4,872,089 | 10/1989 | Ocken et al. | 357/81 |

*Primary Examiner*—Jerome Jackson, Jr.
*Assistant Examiner*—Carl Whitehead, Jr.
*Attorney, Agent, or Firm*—Robert H. Kelly

[57] ABSTRACT

A heat sink/electromagnetic shield assembly for a circuit element disposed upon a circuit board. A spring clip containing at least one hooked projection forming the spring is positioned in a confronting relationship with the circuit element. A U-shaped housing is slidingly positioned over the circuit element and the spring clip to enclose the circuit element and to compress the hooked projection which forms the spring. Compression of the hooked projection causes the hooked projection to exert a spring force to retain the housing in position about the circuit element. The assembly may be constructed in-line during construction of the electrical circuit disposed upon the circuit board.

18 Claims, 4 Drawing Sheets

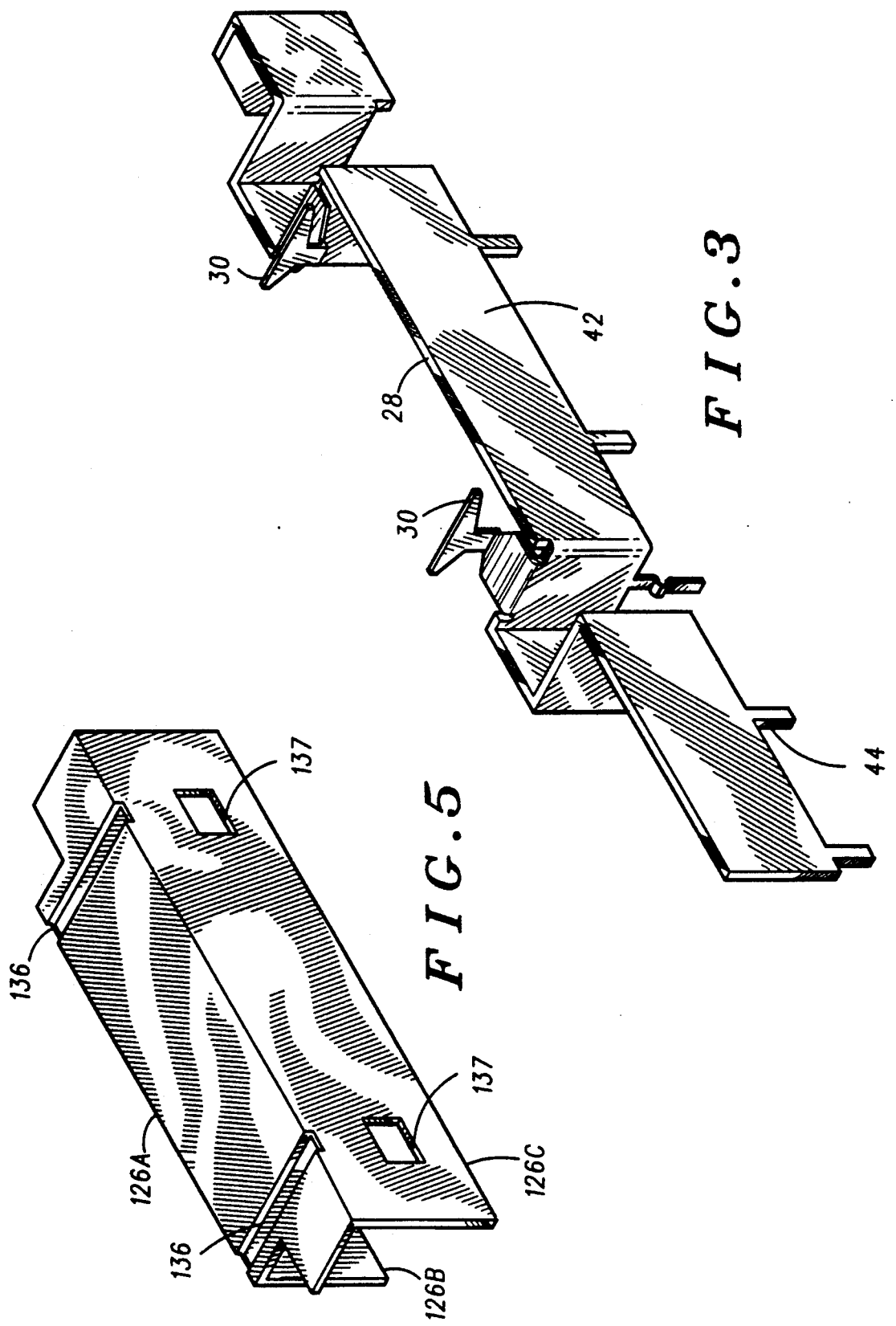

HEAT SINK ASSEMBLY

This is a continuation of application Ser. No. 516,843, filed Apr. 30, 1990, now abandoned.

BACKGROUND OF THE INVENTION

The present invention relates generally to heat dissipative apparatus for electrical circuitry, and, more particularly, to a heat sink which may be assembled in-line with an electrical circuit during assembly thereof.

A byproduct of normal operation of an electrical circuit is thermal energy, i.e., heat. Thermal energy is generated as a result of frictional effects of charge flow during operation of the electrical circuit. Greater charge flows i.e., larger currents, generate greater amounts of thermal energy. If not dissipated, a buildup of thermal energy can cause abnormal operation of the electrical circuit, and can even cause damage to the component elements of the electrical circuit, as well as component elements of other circuits positioned proximate to the component elements.

Generation of thermal energy is particularly significant in amplification elements such as, for example, a power amplifier. Because an amplification element amplifies the values of signals supplied thereto, signals output by the amplification element are oftentimes many times the levels of the signals supplied to the element. However, the efficiency of a typical amplification element is only about 60%; therefore, about 40% of any signal supplied to the amplification element is not amplified, but, rather, is converted into thermal energy. In order to prevent damage from occurring to the amplification element (as well as other component elements positioned proximate thereto), means for dissipating the generated thermal energy is oftentimes positioned in close physical proximity to the amplification element. More particularly, heat sinks comprised of thermally conductive materials are oftentimes positioned directly above the amplification element and a thermally conductive path is created between the element and the heat sink to permit thermal energy contained in, or generated during operation of, the amplification element to be conducted to the heat sink whereat the thermal energy is dissipated by convection.

Heat sinks for other electrical circuit component elements are similarly utilized. For example, heat sinks for several small circuit component elements are available which may merely be clipped or otherwise pressed into position upon the element in order to provide a convective surface whereat heat generated by or contained in the circuit element may be dissipated. For example, E G & G WAKEFIELD ENGINEERING OF Wakefield, Mass. markets a series 298 "pressed top heat sink". This heat sink may be pressed onto a discrete transistor housing and consists of a convective surface and a connecting means comprised of a thermally conductive material to conduct thermal energy away from the transistor to be dissipated by the convective surface. However, no similar heat sink is available for dissipating heat contained in, or generated by, larger circuits.

Existing heat sink apparatus for amplification elements, and other large circuit component elements, comprise an assembly which is affixed to the amplification element. In order to create a thermally conductive path which permits conduction of thermal energy away from the amplification element, a substantial portion of the surface of the element must be maintained in physical abutment with a thermally conductive material comprising a portion of the heat sink assembly to permit conduction of thermal energy thereaway. In order to maintain such physical abutment, these existing heat sink assemblies require threaded shaft members to provide a clamping force for maintaining the thermally conductive material in the physical abutment with the surface of the element. The thermally conductive material provides a thermal conductive path to a convective surface formed by the heat sink assembly.

Such a heat sink assembly is not be assembled in-line during assembly of the electrical circuit, typically disposed upon a circuit board, of which the amplification element, or other circuit component element, forms a portion. Rather, the heat sink and the circuit component is assembled theretogether during a subassembly process, and, only once assembled may the entire subassembly be assembled in-line during assembly of the electrical circuit.

The requirement of a separate subassembly process increases production costs significantly. What is needed, therefore, is a heat sink assembly for a circuit element which may be constructed in-line during assembly of the electrical circuit.

Normal operation of an electrical circuit containing a high frequency oscillator causes generation of high frequency electromagnetic signals. These electromagnetic signals are undesirable as the generated signals can interfere with normal functioning of other electrical circuits. In order to minimize the deleterious effects of such radio frequency electromagnetic signals, electromagnetic shielding materials are oftentimes positioned to cover discrete circuit elements, or even entire electrical circuits. Such shielding materials not only prevent the transmission of the radio frequency electromagnetic signals generated by the electrical circuit over which the shielding material is positioned, but, further, the shielding material shields the circuit elements and/or circuits to prevent transmission of the radio frequency electromagnetic signals generated by other electrical circuits thereto.

Existing electromagnetic shields are typically comprised of a metallic material to prevent the transmission of radio frequency electromagnetic signals. The shield is typically formed of a plate member suitable for positioning above a circuit component element (or entire circuit), and includes side flange portions extending downwardly therefrom to cover side portions of the circuit component element. In order to function properly, the shield must be electrically coupled to the electrical circuit over which the shield is positioned.

Because many electrical devices are packaged in ever-smaller housings, ever-smaller heat sink assemblies and electromagnetic shields are required. In many instances, the heat sink and the electromagnetic shield are combined in a single element. For example, portable transceivers, such as portable, cellular phones, are increasingly miniaturized to permit the transceivers to be of ever-smaller dimensions. A heat sink which further functions as an electromagnetic shield permits increased miniaturization of the portable transceiver.

SUMMARY OF THE INVENTION

It is accordingly an object of the present invention to provide a heat sink assembly which may be assembled in-line during assembly of the electrical circuit to which the heat sink assembly is to be attached.

It is a further object of the present invention to provide a heat sink assembly which further functions as an electromagnetic shield which may be assembled in-line during assembly of the electrical circuit to which the heat sink assembly is to be attached.

It is a still further object of the present invention to provide a heat sink and electromagnetic shield assembly for a portable transceiver which may be assembled in-line during assembly of the transceiver electrical circuits.

In accordance with the present invention, an assembly for dissipating thermal energy contained in an electrical circuit having at least one circuit element is disclosed. The assembly includes a convective surface for dissipating heat conducted and convected thereto, and is maintained in a desired position relative to the circuit element by exerting a retentive spring force thereupon. Preferably, the convective surface is comprised of a metallic material, and is electrically connected to the electrical circuit over which the convective surface is positioned such that the convective surface further functions as an electromagnetic shield.

BRIEF DESCRIPTION OF THE DRAWINGS

The present invention will be better understood when read in light of the accompanying drawings in which:

FIG. 3 is a perspective illustration of a bracket forming a portion of the preferred embodiment of the heat sink assembly of the present invention;

FIG. 5 is a perspective illustration of the housing forming a portion of the present invention utilized with the spring clip of FIG. 4;

DESCRIPTION OF THE PREFERRED EMBODIMENTS

Figure 1:
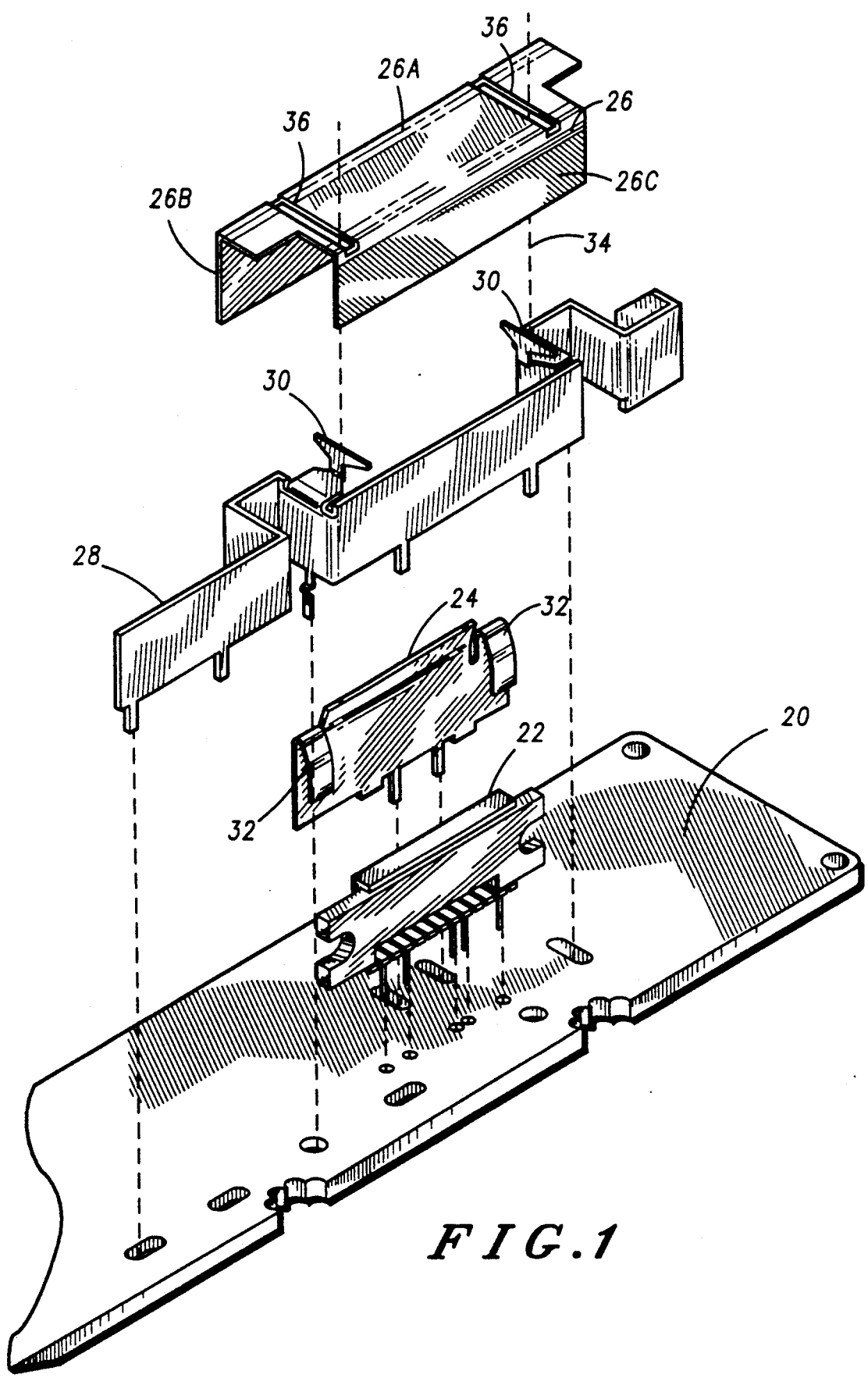
FIG. 1 is a perspective illustration, partially exploded, of the heat sink assembly of the present invention.

Referring first to the perspective illustration of FIG. 1, there is shown the heat sink assembly of the present invention positioned upon circuit board 20. The heat sink assembly is positioned about circuit element 22, shown in hatch, which comprises a portion of an electrical circuit disposed upon circuit board 20. The heat sink assembly of the present invention includes spring clip 24, U-shaped housing 26, and preferably, bracket member 28. Bracket member 28 is mounted upon circuit board 20 and has a face surface portion for positioning against a face surface of circuit element 22 to support circuit element 22 thereagainst. Circuit element 24, shown in hatch in the Figure, is rectangular in shape, similar to the shape of a power amplifier, and bracket member 28 contains folds to permit supportive engagement of a face surface of bracket member 28 against a corresponding face surface of circuit element 22. It is to be noted, of course, that bracket member 28 may be alternately shaped to provide a face surface to abut against a differently-shaped circuit element 22 to permit supportive engagement thereagainst. Bracket member 28 further includes upwardly projecting tab members 30 formed integral with the bracket member.

Spring clip 24 is positioned such that a face surface thereof abuts against a face surface of circuit element 22. Preferably, and as illustrated, the face surface of spring clip 24 abuts against a face surface of circuit element 22 opposite that of the face surface of circuit element 22 abutting against the face surface of bracket member 28. Spring clip 24 includes at least one, and preferably two, hooked projections 32 formed integral with the clip 24. Spring clip 24, and hooked projections 32 projecting therefrom, are comprised of a flexible material such as, for example, a spring-temper, copper-berillium alloy. Compressive forces applied to hooked projections 32 bias the projections, thereby creating a spring force. Spring clip 24, similar to bracket member 28, is further preferably mounted upon circuit board 20.

U-shaped housing 26, positioned in the exploded view of FIG. 1 above the circuit board 20, may be positioned to cover circuit element 22 by translating housing 26 in the vertical direction illustrated by arrows 34 to thereby position the housing 26 about circuit element 22 about three sides thereof. U-shaped housing 26 contains at least one surface comprised of a thermally conductive material, such as aluminum or copper, to form a convective surface. In the preferred embodiment, housing 26 is integrally formed of aluminum, and includes convective surface 26a having side flanges 26b and 26c projecting downwardly from opposing sides of surface 26a. Convective surface 26a further contains slotted openings 36 formed to correspond in position with fastening tabs 30 projecting upwardly from bracket member 28. When housing 26 is suitably positioned to enclose circuit element 22 about three sides thereof, fastening tabs 30 extend through slotted openings 36 of housing 26. Once suitably positioned to extend through slotted openings 36, torsional and/or bending forces may be applied to fastening tabs 30 to deflect tabs 30 out of their respective vertical projections to prevent dislocation of housing 26.

When face surfaces of spring clip 24 and bracket member 28 abut against face surfaces of circuit element 22, circuit element 22 is sandwiched therebetween. By positioning housing 26 such that convective surface 26a rests directly above circuit element 22, the circuit element 22 (as well as spring clip 24 and a portion of bracket member 28) is surrounded by housing 26. Thermal energy contained in, or generated by, circuit element 22 is conducted through clip 24 and bracket 28 to convective surface 26a and flange portions 26b and 26c of housing 26. The thermal energy is dissipated by the surfaces of flanges 26b and c, as well as the convective surface 26a formed integrally therewith, by convection and radiation.

Figure 2:
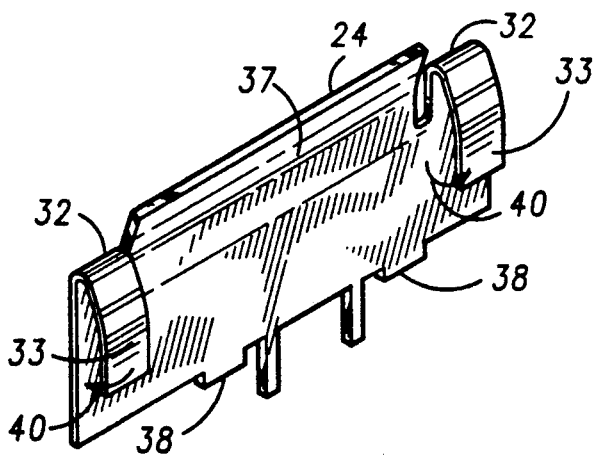
FIG. 2 is a perspective illustration of a spring clip forming a portion of the heat sink assembly of the present invention.

Turning now to FIG. 2, spring clip 24 forming a portion of the assembly of the present invention is shown in greater detail. Clip 24 is preferably comprised of a flexible, thermally conductive material, such as, as previously mentioned, a spring-temper, copper-berillium alloy. Spring clip 24 is of dimensions to form a face surface 37 which may be positioned in a confronting relationship with a thermal energy-containing circuit element. Hooked projections 32 are formed integral with clip 24, and may be constructed by a conventional progressive die process. Surfaces 33 of projections 32 abut against circuit element 22 to form a conductive path to conduct thermal energy thereaway.

Projecting from an end of spring clip 24 opposite that of hooked projections 32 are one or more foot members 38. Foot members 38 are formed integral with clip 24 and project downwardly to engage with circuit board 20 to permit mounting thereupon. In the preferred embodiment of the present invention, foot members 38 of clip 24 are affixed to a ground plane of an electrical circuit disposed upon circuit board 20 to permit electrical connection therewith. Foot members 38 may be affixed to circuit board 20 by any conventional means, such as, for example, by a reverse flow weld material. Application of a compressive force in the direction illustrated by arrows 40 compresses the hooked projections 32 to generate a compressive spring force thereby.

FIG. 3 illustrates the bracket member 28 forming a portion of the preferred embodiment of the heat sink assembly of the present invention. Bracket member 28 is comprised of an elongated strip of thermally conductive material, such as, for example, a preplated cold-rolled steel or other thermally conductive material. Bracket member 28 contains folds to form at least one face surface 42 which may be positioned in a confronting relationship with a circuit element such as circuit element 22 of FIG. 1. Face surface 42 formed of a portion of bracket member 28 is of dimensions to form a conductive path to facilitate conduction of thermal energy contained in, or generated by, circuit element 22 thereaway. Projecting upwardly from a top side of bracket member 28 are fastening tabs 30. As mentioned previously, fastening tabs 30 may be inserted through slotted openings 36 formed to extend through convective surface 26a of housing 26. Similar to foot members 38 of spring clip 24, foot members 44 formed integral with bracket member 28 and projecting downwardly therefrom at a side of bracket member 28 opposing that of fastening tabs 30, engage with circuit board 20 to permit mounting engagement thereto. Again, foot members 44 preferably engage with a ground plane of the electrical circuit disposed upon circuit board 20 to maintain bracket member 28 in electrical connection therewith.

Because both spring clip 24 and bracket member 28 are comprised of metallic materials, positioning of U-shaped hosuing 26 thereabout electrically connects the housing 26 to clip 24 and bracket 28, and, hence, to the ground plane of the electrical circuit disposed upon circuit board 20. By enclosing circuit element 22 about three sides thereof by surface 26a, and flanges 26b and 26c, respectively, and by creating an electrical connection between housing 26 and the electrical circuit disposed upon circuit board 20, housing 26 further functions as a radio frequency electromagnetic shield. More particularly, inner sides of surface 26a and flanges 26b and 26c prevent transmission of electromagnetic energy generated by the electrical circuit and/or circuit element positioned therebeneath, and outer sides of surface 26a and flanges 26b and 26c prevent transmission of electromagnetic energy generated elsewhere to the electrical circuit and/or circuit element.

Figure 4:
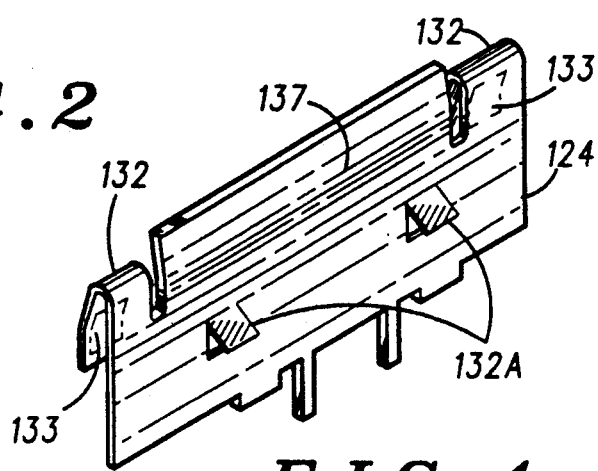
FIG. 4 is a perspective illustration, similar to that of FIG. 2, but illustrating a spring clip of an alternate embodiment of the present invention.

Turning now to the perspective illustration of FIG. 4, there is shown a further embodiment of a portion of the assembly of the present invention. Spring clip 124 of FIG. 4 differs from spring clip 24 of FIG. 2 in that, in addition to hooked projections 132, spring clip 124 further includes snap members 132A. The snap members 132A are cut about three sides thereof from the face surface of clip 124. Bending forces applied to the projections 132 cause rotation of the projections 132 out of the plane of the face surface 137 of the body of clip member 124. Similar to surfaces 33 of projections 32 of spring clip 24, surfaces 133, shown in hatch, abut against a circuit element, such as circuit element 22, to form a conductive path to conduct thermal energy thereaway.

FIG. 5 illustrates U-shaped housing 126 which may be utilized in conjunction with the spring clip 124 of FIG. 4. Housing 126 of FIG. 5 differs from housing 26 illustrated in FIG. 1 only in that housing 126, in addition to slotted openings 136, further includes slotted openings 137 formed to extend through side flanges 126b and/or 126c extending downwardly from side portions of convective surface 126a. Slotted openings 137 are formed to correspond in position with the snap members 132A of spring clip 124. When housing 126 is positioned to enclose circuit element 22, sliding of housing 126 into position causes compression of snap members 132A. The spring force exerted by snap members 132A, once snaps 132A are aligned with openings 137, cause the snaps 132A to project through slotted openings 137 to thereby maintain the housing 126 in position about circuit element 22. Hooked projections 132 function similar to hooked projections 32 as described hereinabove.

The heat sink assembly of the present invention is advantageous for the reason that the assembly may be assembled in-line during assembly of the electrical circuit upon circuit board 20. The assembly need not be assembled as the subassembly process necessitated to assemble existing heat sink assemblies. Each component portion of the assembly may be affixed to or mounted upon circuit board 20 in a single direction, similar to the positioning required to position any circuit component element disposed upon the circuit board 20.

Figure 6:
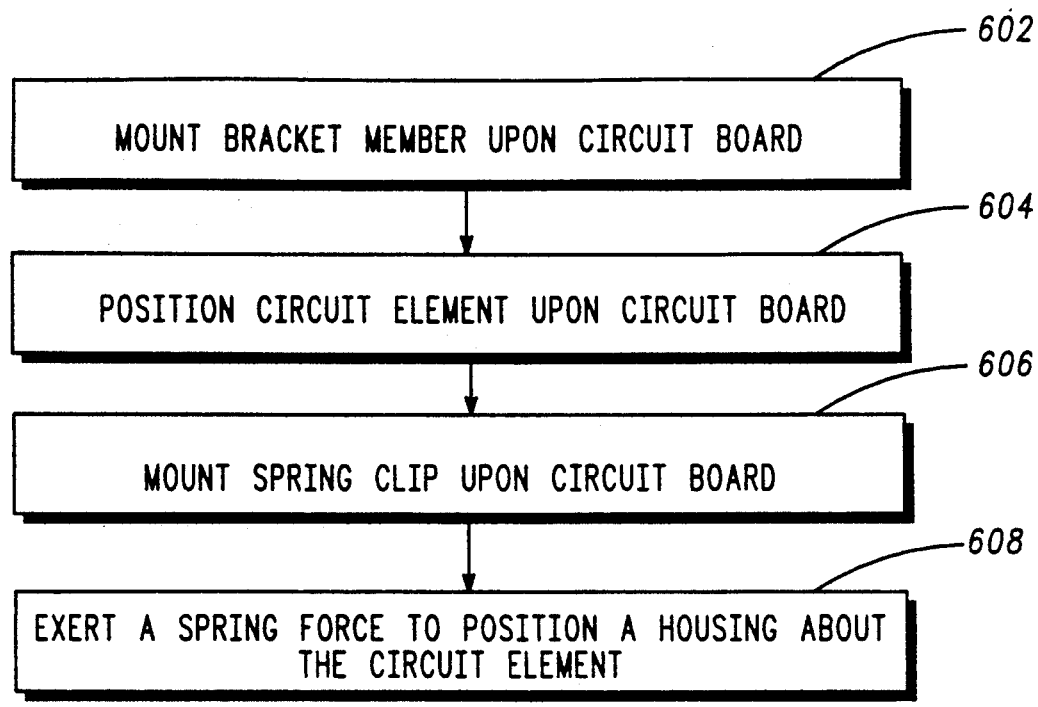
FIG. 6 is a flow diagram illustrating the method steps of the method of the preferred embodiment of the present invention for constructing the heat sink assembly.

Therefore, in the preferred embodiment of the present invention, a method for constructing a heat sink assembly upon circuit board 20 comprises the steps illustrated in the flow diagram of FIG. 6. The method may be carried out during an assembly line-like, automated process. Preferably, circuit board 20 is prebored to permit installation (i.e., mounting) of the assembly component portions by an automated process. First, and illustrated by block 602, bracket member 28 is mounted upon circuit board 20 by insertion of foot members 44 through pre-formed bores extending into circuit board 20. Next, and illustrated by block 604, circuit element 22 is disposed upon circuit board 20 to form a portion of the electrical circuit thereby. Alternately, circuit element 22 may be already disposed upon circuit board 20 prior to installation of the assembly of the present invention. It is important to note, however, that each component portion of the assembly of the present invention is mounted upon circuit board 20 in the same manner that circuit element 22, or any other circuit element is positioned upon circuit board 20. Next, illustrated by block 606, spring clip 24 is mounted upon circuit board 20 by inserting foot members 38 through appropriately positioned bores extending into circuit board 20. Foot members 38 of spring clip 24, as well as foot members 44 of bracket member 28, are preferably electrically connected to a ground plane of a circuit disposed upon circuit board 20, and may be electrically coupled to the ground plane by reflow solder techniques connecting the foot members 38 and 44 to the ground plane. Once spring clip 24, and, in the preferred embodiment, also bracket member 28, have been mounted upon circuit board 20, U-shaped housing 26 may be lowered into position to enclose circuit element 22 by sliding the flange portions of housing 26 over the clip 24 and bracket 28, as illustrated by block 608, to compress the hooked projections which, in turn, exert a spring force. Such spring force maintains the housing 26 in position to enclose circuit element 22. More particularly, the spring forces exerted by hooked projections 132 are transmitted to flange portions 26b and/or 26c formed integral with convective surface 26a to maintain the housing 26 in position thereby.

Thermal energy contained in, or generated by, circuit element 22 is conducted away from the circuit element through surface 42 of bracket 28 to the U-shaped housing 26 to be dissipated thereat by convection and radiation. Additionally, thermal energy is conducted away from the circuit element through surfaces 33 of spring clip 24 to the U-shaped housing 26 to be dissipated thereat by convection and radiation. Thermal energy may also be convected directly to the housing 26 to be dissipated thereat. Additionally, because hooked projections 32 of spring clip 24 electrically connect housing 26 and the ground plane of the electrical circuit disposed upon circuit board 20 (through foot members 38), the housing 26 further functions as an electromagnetic shield for absorbing radio frequency electromagnetic energy transmitted by circuit element 22, or radio frequency electromagnetic energy transmitted to circuit element 22 from other circuits.

Figure 7:
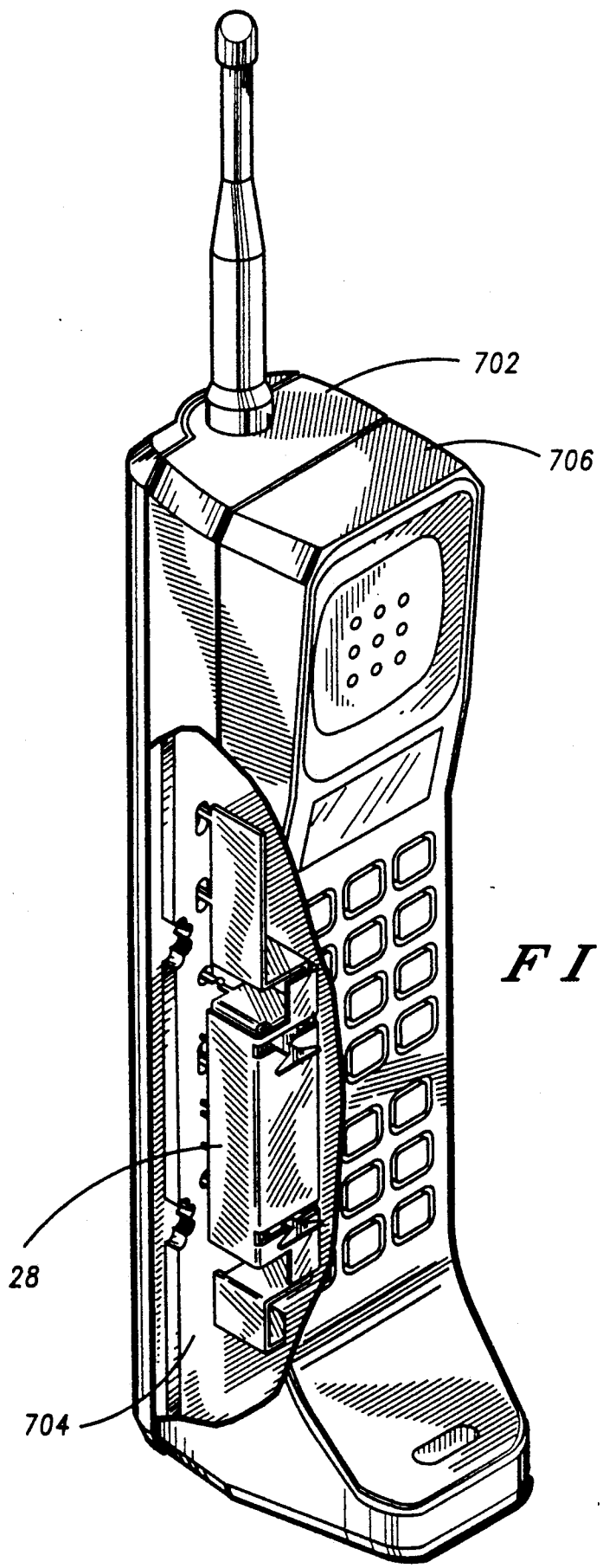
FIG. 7 is a cutaway, perspective illustration of a transceiver having a heat sink assembly constructed according to the teachings of the present invention included therewith.

Turning now to FIG. 7, there is shown a portable transceiver 702 having transmit/receive circuitry disposed upon circuit boards 704 and housed within housing 706. The assembly of the present invention is advantageously utilized to provide a heat sink and shield for a circuit element, such as a power amplifier disposed upon circuit board 704. Because the assembly of the present invention may be assembled during assembly of the transmit/receive circuitry disposed upon circuit board 704, significant assembly cost savings are permitted. Additionally, because the assembly functions as both a heat sink and an electromagnetic shield, space requirements for the heat sink/shield are minimized. Bracket member 28 further absorbs drop, vibrational, and thermal bending forces which would otherwise be transmitted directly to the circuit element 22, such as the power amplifier.

While the present invention has been described in connection with the preferred embodiments of the various figures, it is to be understood that other similar embodiments may be used and modifications and additions may be made to the described embodiments for performing the same function of the present invention without deviating therefrom. Therefore, the present invention should not be limited to any single embodiment, but rather construed in breadth and scope in accordance with the recitation of the appended claims.

What is claimed is:

1. An assembly for dissipating thermal energy contained in an electrical circuit disposed upon an electrical circuit board, and having at least one circuit element, said assembly comprising:

means forming a housing having at least one convective, face surface for dissipating heat conducted and convected thereto;

means separable from the housing formed by the means for dissipating heat for positioning said housing in a position proximate to the circuit element of the electrical circuit, said means for positioning having at least one foot member integrally formed therewith to affix the means for positioning to the electrical circuit board thereby, and said means for positioning further having means for exerting a retentive spring force forming at least one spring element wherein said at least one spring element protrudes from a surface of the means for positioning and engages with the housing to retain thereby the housing in said position proximate to the circuit element; and means forming a bracket having a face surface thereof positioned in a confronting relationship with a corresponding face surface of the circuit element for supporting the circuit element of the electrical circuit thereagainst, said means for supporting having at least one foot member integrally formed therewith to affix the means for supporting to the electrical circuit board thereby.

2. The assembly of claim 1 wherein said means for positioning further provides a thermal conductive path for conducting thermal energy away from the circuit element and to the convective, face surface of the means for dissipating heat to be dissipated thereat.

3. The assembly of claim 1 wherein said means for dissipating heat, said means for positioning, and said means for supporting are comprised of electrically conductive materials.

4. The assembly of claim 3 wherein said means for dissipating heat, said means for positioning, and said means for supporting are electrically connected theretogether.

5. The assembly of claim 4 further comprising means for electrically connecting the convective, face surface of the housing formed by the means for dissipating heat and the electrical circuit such that said convective surface forms a shielding surface thereby.

6. The assembly of claim 5 wherein said means for electrically connecting connects the means for dissipating heat and a ground plane of the electrical circuit.

7. The assembly of claim 6 wherein said means for electrically connecting is comprised of the at least one foot member formed integral with the means for positioning.

8. The assembly of claim 1 wherein said housing formed by the means for dissipating heat further comprises downwardly extending flange portions wherein the housing having said flange portions and the covective, face surface is of a U-shaped cross section.

9. The assembly of claim 8 wherein the at least one spring element formed of the means for positioning comprises at least one hooked projection for springingly engaging with the flange portions of the housing wherein compression of said hooked projection provides the retentive spring force for retaining the housing in said position proximate to the circuit element.

10. The assembly of claim 1 wherein said bracket is comprised of a thermally conductive material for conducting thermal energy away from the circuit element of the electrical circuit supported thereagainst.

11. The assembly of claim 10 further comprising a means for fastening the bracket to the housing.

12. The assembly of claim 11 wherein said means for fastening comprises at least one fastening tab formed integral with the bracket and projecting upwardly therefrom, said fastening tab engaging with the housing formed by the means for dissipating heat to fasten the housing to the bracket thereby.

13. The assembly of claim 12 further comprising means forming slotted openings through the housing for inserting the fastening tab therethrough.

14. A heat sink assembly for dissipating heat generated by operation of an electrical circuit having at least one circuit element disposed upon a circuit board, said assembly comprising:
- a U-shaped housing having at least one convective, face surface, said U-shaped housing positioned about three sides of the circuit element;
- a spring clip having a face surface and at least one hooked projection projecting therefrom and engaging with the U-shaped housing for exerting a spring force for retaining the U-shaped housing in position about the three sides of the circuit element; and
- a bracket having a face surface thereof positioned in a confronting relationship with a corresponding face surface of the circuit element for supporting the circuit element of the electrical circuit thereagainst.

15. The heat sink assembly of claim 14 wherein said U-shaped housing and said spring clip are comprised of electrically conductive materials.

16. The heat sink assembly of claim 15 wherein the U-shaped housing is electrically connected to the electrical circuit such that the U-shaped housing forms radio frequency electromagnetic energy shield thereby.

17. The heat sink assembly of claim 16 further comprising a bracket supporting the circuit element for absorbing vibration, thermal, and drop forces exerted upon the circuit element.

18. A portable transceiver comprising the combination of:
- a transceiver housing;
- a portable power supply;
- transmit/receive circuitry forming at least one circuit disposed upon an electrical circuit board, said transmit/receive circuitry having at least one circuit element; and
- a heat sink assembly for dissipating thermal energy contained in the transmit/receive circuitry, said heat sink assembly having means forming a housing having at least one convective, face surface for dissipating heat conducted and convected thereto; means separable from the housing formed by the means for dissipating heat for positioning said housing in a position proximate to the circuit element of the transmit/receive circuitry said means for positioning having at least one foot member integrally formed therewith to affix the means for positioning to the electrical circuit board thereby, and said means for positioning further having means for exerting a retentive spring force forming a first spring element and a second spring element spaced-apart therefrom wherein said first and second spring elements, respectively each protrude from a surface of the means for positioning and engage with the housing to retain thereby the housing in said position proximate to the circuit element; and means forming a bracket having a face surface thereof positioned in a confronting relationship with a corresponding face surface of the circuit element of the transmit/receive circuitry thereagainst, said means for supporting having at least one foot member integrally formed therewith to affix the means for supporting to the electrical circuit board thereby.

* * * * *